(12) United States Patent
Gao

(10) Patent No.: US 11,690,201 B2
(45) Date of Patent: Jun. 27, 2023

(54) SERVER ARCHITECTURE FOR HYBRID SYSTEM INTEGRATION AND INTERFACE MANAGEMENT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 57 days.

(21) Appl. No.: 17/351,561

(22) Filed: Jun. 18, 2021

(65) Prior Publication Data

US 2022/0408610 A1    Dec. 22, 2022

(51) Int. Cl.
*H05K 7/20* (2006.01)
(52) U.S. Cl.
CPC ..... *H05K 7/20781* (2013.01); *H05K 7/20281* (2013.01); *H05K 7/20736* (2013.01)
(58) Field of Classification Search
CPC .................................................. H05K 7/1487
See application file for complete search history.

(56) References Cited

U.S. PATENT DOCUMENTS 10,349,560 B2 *  7/2019  Norton ............... H05K 7/20172
2011/0313576 A1 * 12/2011  Nicewonger ...... H05K 7/20781
                                                     361/701

* cited by examiner

Primary Examiner — Mukundbhai G Patel
(74) Attorney, Agent, or Firm — Womble Bond Dickinson (US) LLP

(57) ABSTRACT

Embodiments are disclosed of an apparatus including a utility section adapted to be positioned in a server chassis and coupled to an electronics section in the server chassis. The utility section includes a power board, a fluid handling module, a fan module electrically coupled to the power board, or both the fluid handling module and the fan module. An external power interface is adapted to electrically couple the power board to a rack power source and an internal power interface is adapted to electrically coupled the power board to one or more servers in an electronic section within the chassis. An external fluid interface is adapted to fluidly couple the fluid handling module to a rack fluid recirculation loops, and an internal fluid interface is adapted to fluidly couple the fluid handling module to a server fluid inlet and a server fluid outlet of each of the one or more electronics sections.

20 Claims, 8 Drawing Sheets

SERVER ARCHITECTURE FOR HYBRID SYSTEM INTEGRATION AND INTERFACE MANAGEMENT

TECHNICAL FIELD

The disclosed embodiments relate generally to servers and in particular, but not exclusively, to server architectures that can be used in an information technology (IT) rack of the kind found in data centers.

BACKGROUND

Modern data centers like cloud computing centers house enormous amounts of information technology (IT) equipment such as servers, blade servers, routers, edge servers, power supply units (PSUs), battery backup units (BBUs), etc. These individual pieces of IT equipment are typically housed in racks within the computing center, with multiple pieces of IT equipment in each rack. The racks are typically grouped into clusters within the data center.

As IT equipment has become more computationally powerful it also consumes more electricity and, as a result, generates more heat. This heat must be removed from the IT equipment to keep it operating properly. To keep up with this increasing need for heat removal, IT equipment has incorporated internal liquid cooling systems and, at the same time, the IT racks in which IT equipment is housed have incorporated rack-level liquid cooling systems that interface with the internal liquid cooling systems of the IT equipment.

One problem with current server liquid cooling and rack-level liquid cooling systems is that they can leak, potentially causing damage to themselves, to the IT equipment to which they are coupled, and to other IT equipment housed in the same rack. Designing a rack-level liquid cooling system that eliminates the single failure point is challenging; simple changes, such as adding fluid distribution components to the rack, might not function properly because such rack-level changes often require corresponding changes in the IT equipment—changes that can only be made effectively by designing the rack and IT equipment together. And existing solutions may not provide mature solution for responding the incidents of fluid leakage.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
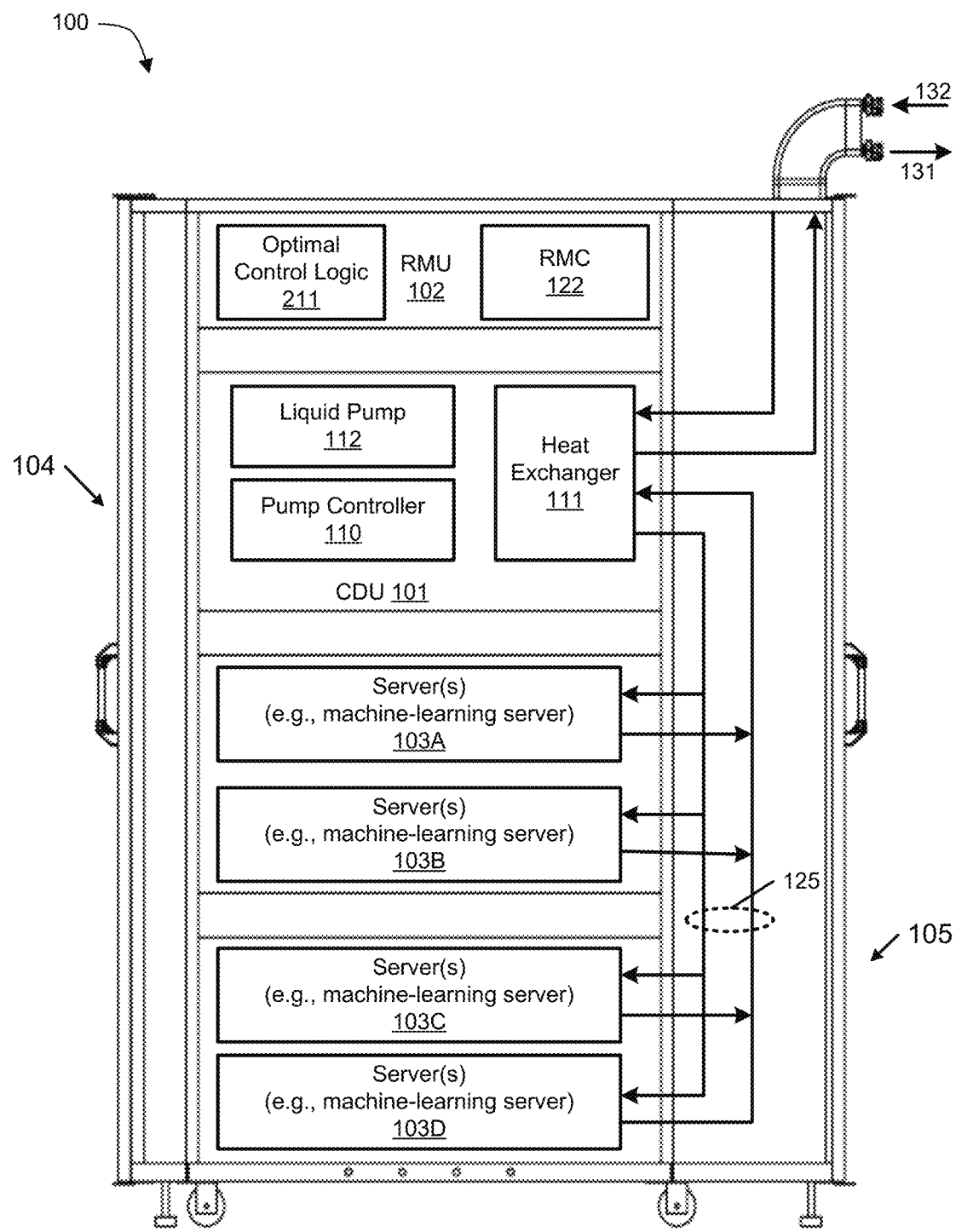
FIG. 1 is a side view of an embodiment of a liquid-cooled information technology (IT) rack populated with various pieces of IT equipment.

Embodiments are described of a server architecture for that can be used in an information technology (IT) rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

The described embodiments provide efficient and flexible server design architectures for implementing hybrid systems (i.e., systems that use both air cooling and liquid cooling). The disclosed embodiments improve the high power density server system design with different cooling solutions and also aim to solve the following challenges:

Simplifying server system design.
Segregating the power and cooling solutions from the main electronic components.
Integrating localized fluid management, including fluid shutdown during failure scenarios.
Simplifying system interfaces to increase interoperability.
Integrating with exiting rack hardware system, which means the solution does not require rack level modifications.
Providing a highly reliable solution.

Existing solutions use design architectures that might not easily accommodate different configurations and integrate new features and functions. In addition, existing solutions are highly correlated to a rack-level architecture, meaning that the system design may not flexible enough. The disclosed embodiments describe a server architecture that can significantly improve efficiency, usability, and ease of implementation with new features and functions. The described embodiments use a server architecture in which power and cooling components are segregated from the main electronic components and the corresponding interfaces include integrated response mechanisms for power and cooling management.

The described embodiments include two main sections: a utility section that provides at least electrical power and cooling, and a main electronics section. Segregation of the two sections completely separates them from each other, and there are standard interfaces for connecting the two sections, including power interfaces and fluid interfaces. Both sections are integrated in a server chassis and then populated into server racks. The power system is also used to directly powering the liquid cooling system's leak response devices. The design enables a full system-level leak response and module-level leak response for different scenarios. A system response process is described to enable advanced control and management of power and fluid interfaces.

FIG. 1 is a block diagram illustrating a side view of an embodiment of an information technology (IT) rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a server architecture such as the ones shown in FIGS. 2A-2B et seq. can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2A:
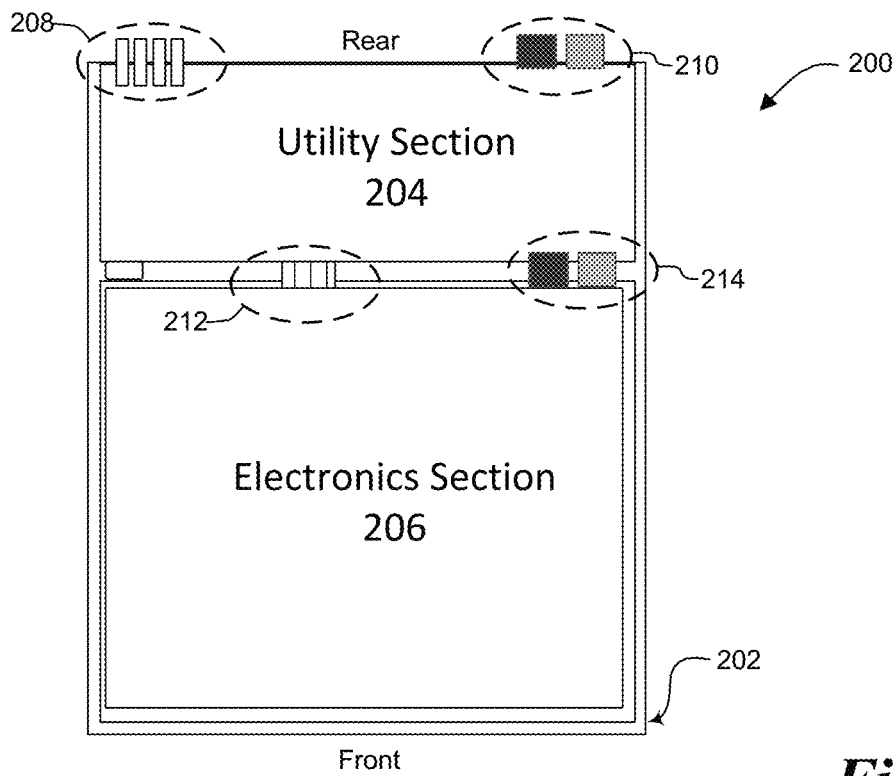
FIGS. 2A-2B are plan views of embodiments of server architectures.
Figure 2B:
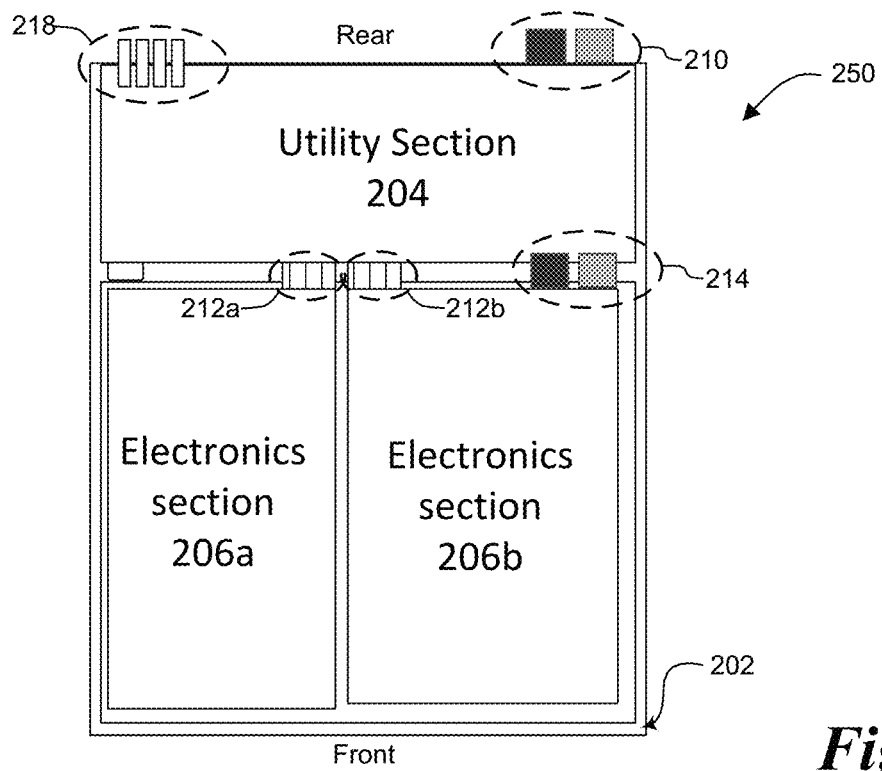

FIGS. 2A-2B illustrate embodiments of server architectures. FIG. 2A illustrates a server 200 including a utility section 204 and an electronics section 206 that are positioned within a server chassis 202. Server 200 can then be inserted as a complete unit into an IT rack such as the one shown in FIG. 1. Aside from the interfaces with which it is coupled to the rack and the electronics section, utility section 204 is physically segregated from electronics section 206 so that, if there are any failures such as leaks within utility section 204, damage in electronics section 206 is minimized or eliminated. Segregation of the utility section from the electronics section also allows for easy customization of utilities—electrical power, air cooling, liquid cooling, etc.— to match the needs of the electronic components in the electronics section. For instance, if the electronic components within electronics section 206 are air-cooled, the utility section is adjustable to meet that need without having to modify the electronics at all. Similarly, if electronic components within electronics section are liquid-cooled, then the utility section is adjustable to meet that need.

Utility section 204, as its name implies, provides utility functions such as electrical power, air cooling, liquid cooling, and so on, to one or more pieces of IT equipment, such as servers in one embodiment, positioned in electronics section 206. In the illustrated embodiment utility section 204 is positioned at the rear of chassis 202, but in other embodiments utility section 204 can be positioned elsewhere in the server chassis. Utility section 204 is physically segregated from electronics section 206 and includes several external interfaces or links that allow the utility section to be coupled to components outside server 200 and several internal interface that allow utility section 204 to be coupled to components inside server 200 such as electronics section 206. In the illustrated embodiment, the external interfaces allow the utility section to be coupled to the rack in which server 200 is housed, and the internal interfaces allow utility section 204 to be coupled to electronics section 206. In the illustrated embodiment, the external interfaces include an external power interface 208 and an external fluid interface 210.

External power interface 208 electrically couples the utility section to the rack's power delivery system, typically an electrical busbar positioned at the rear of the rack. External fluid interface 210 fluidly couples fluid handling components within utility section 204 to fluid supply and return lines in the rack.

The utility section's internal interfaces include an internal power interface 212 that electrically couples the utility section to the electronics section or to electronic components within the electronics section, and an internal fluid interface 214 that fluidly couples fluid handling components within utility section 204 to fluid inlets and outlets in the electronics section. Other embodiment can, of course, have more or less interfaces than shown; for instance, embodiments of utility section 204 that only service air-cooled electronics need not have fluid interfaces 210 and 214. In some embodiments, mechanical connections can be used to assist with coupling the interfaces. Details of embodiments of utility sections are discussed below in connection with FIGS. 3-5.

Electronics section 206 is designed to house the electronic components and cooling components to which the utility section 204 provides services. Although described mostly as "servers," the electronics in electronics section 206 need not be limited to electronics components associated with servers, but can be electronic components associated with other types of IT equipment. Use herein of the term "server" should therefore be interpreted to include all types of IT equipment, including but not limited to actual servers.

FIG. 2B illustrates a server 250 that is, in most respects, similar to server 200: it includes a utility section 204 with external interfaces and internal interfaces. But utility section 204 is not limited to servicing a single electronics section, and the primary difference between server architectures 250 and 200 is that in server architecture 250 utility section 204 services multiple electronics sections 206. Put differently, server 200 has a one-to-one correspondence between utility sections and electronics sections, but server 250 has a one-to-many correspondence between utility sections and electronics sections. Other embodiments (not shown) can have a many-to-one correspondence between utility sections and electronics sections. The illustrated embodiment has two electronics sections 206a and 206b coupled to a single utility section 204, but other embodiments can include more than two electronics sections coupled to utility section 204.

In some embodiments of server 250 the set of internal interfaces can be the same for every one of the multiple electronics sections, but that is not required; the number and type of external and internal interfaces in utility section 204 can be tailored to the number of electronics sections and the type of IT equipment within individual electronics sections. In other words, in a utility section that supports multiple electronics sections the utility section's internal interfaces need not be the same for every electronics section. In the illustrated embodiment, for instance, both electronics sections 206 have a corresponding internal power interface 212: electronics section 206a has internal power interface 212a and electronics section 206b has internal power interface 212. But if electronics section 206a includes only air-cooled electronics and electronics section 206b only requires liquid cooling, an internal fluid interface 214 need only be provided for electronics section 206b but not for electronics section 206a.

Figure 3:
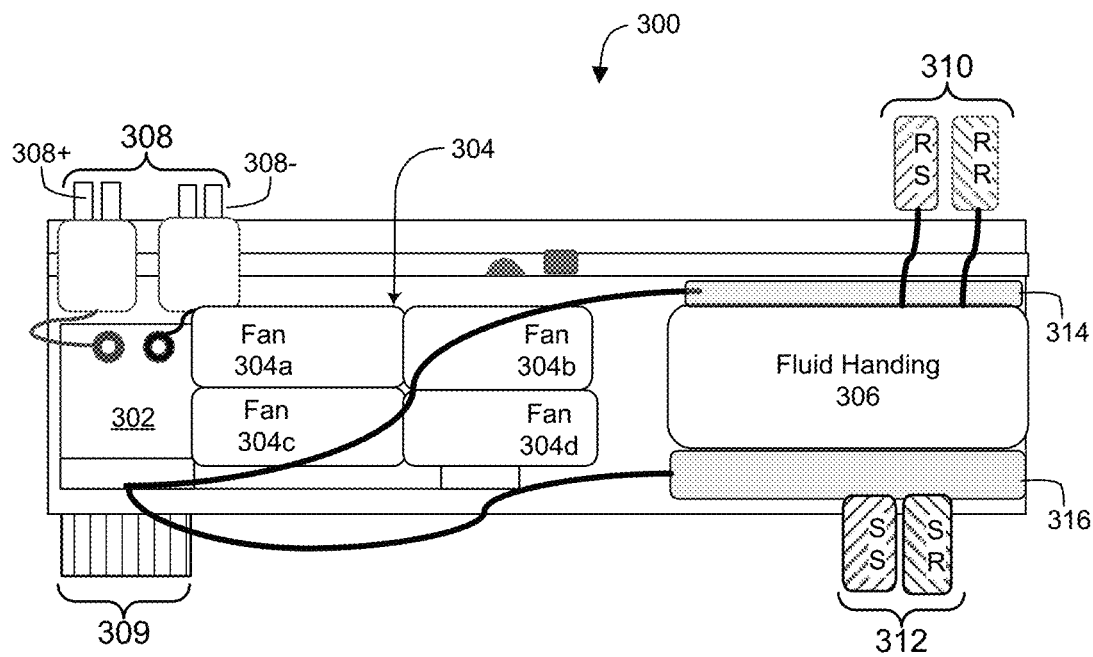
FIG. 3 is a plan view of an embodiment of a utility section that can be used in the server architectures of FIGS. 2A-2B.

FIG. 3 illustrates an embodiment of a utility section 300 that can be used as utility section 204 in systems 200 or 250. Utility section 300 includes three main components—a power board 302, a fan module 304, and a fluid handling module 306—but not all embodiments need include the same components. Other embodiments, for instance, can omit the fan module or the fluid handling module. The positioning within utility section 300 of the power board, fan module, and fluid handling module is generally dictated by the requirements of the electronics within the electronic section and the configuration of the rack, so that other embodiments of utility section 300 need not arrange the power board, fan module, and fluid handling module as shown.

Power board 302, as its name suggests, provides electrical power to the components within utility section 300 as well as to the components in electronic section that will be coupled to the utility section. Power board 302 can be electrically coupled to a power source such as a rack busbar using external power interface 308, which includes a pair of clips: positive clip 308+ and negative clip 308−. Power board 302 is similarly electrically coupled to an electrical section using internal power interface 309, which in one embodiment can be an orientation-independent connector but in other embodiments can be another type of connector. Power board 302 can also be electrically coupled to other components within utility section 300, such as the fan module, fluid handling module, response mechanisms, sensors, etc., to provide electrical power to those components.

Fan module 304 is designed and positioned to provide forced convection to electronics sections that use air cooling. Module 304 includes one or more individual fans; in the illustrated embodiment, fan module 304 has four individual fans 304a-304d, but other embodiments of fan module 304 can include more or less individual fans than shown, including a single fan. Fan module 304 is electrically coupled to power board 302 to provide electrical power to the individual fans. The internal interface for the fan module (not shown) can be a grating that allows air from the fans to enter the relevant electronic section, but in other embodiments the internal interface to the fan module can be a duct that directs air from the fan module into the electronics section.

Fluid handling module 306 can include various fluid-handling elements such as pumps, manifolds, etc. The fluid handling module is positioned within utility section 300 so that external fluid interface 310 can connect to a corresponding fluid interface in the rack. External fluid interface 310 is fluidly coupled to fluid handling module 306 and includes an external supply connector RS and an external return connector RR; external supply connector RS can be fluidly coupled to a rack supply rack fluid supply, and external return connector RR can be fluidly coupled to a rack fluid return. In one embodiment, the fluid connection between connectors RS and RR and a corresponding connector in the rack can be a dripless blind-mating connection, but in other embodiments it can be another type of connection such as a manual connection. Similarly, fluid handling module 306 is fluidly coupled to internal fluid interface 312, which includes an internal supply connector SS and an internal return connector SR; internal supply connector SS can be fluidly coupled to an inlet of the server's liquid-cooling system, while internal return connector SR can be fluidly coupled to an outlet of the server's liquid cooling system. In one embodiment, the fluid connection between connectors SS and SR and a corresponding connector in the server can be a dripless blind-mating connection, but in other embodiments it can be a different type of connection such as a manual connection. In one embodiment, external fluid interface 310 and internal fluid interface 312 can use the same type of connector, but in other embodiments they need not use the same type of connector.

In addition to its main components, utility section 300 includes one or more response mechanisms that allow the utility section to respond in case a fault such as a leak arises. Generally, response mechanisms can be used with any external interface or internal interface in utility section 300 to enable or disable the external interfaces and internal interfaces that couple the utility section to one or more electronics section. Additional response mechanisms can also be located in electronics section instead of or in addition to the utility section (see, e.g., FIG. 8). In utility section 300, external flow response mechanism 314 is electrically coupled to power board 302 and fluidly coupled to external fluid interface 310 and is adapted to enable and disable external fluid interface 310 in case a leak is detected. Internal flow response mechanism 316 is electrically coupled to power board 302 and fluidly coupled to internal fluid interface 312 and is adapted to enable and disable internal fluid interface 312 in case a leak is detected. Fluid interfaces are enabled if fluid can flow through them and disabled if no fluid can flow through them.

In one embodiment, external flow response mechanism 314 can be a mechanism that physically engages and disengages external supply connector RS and external return connector RR from their corresponding connectors in the rack. In one embodiment, external flow response mechanism 314 can be an electromagnetic mechanism that physically engages connectors RS and RR when energized and physically disengages connectors RS and RR when the de-energized. In one embodiment, for instance, external flow response mechanism 314 can be an electromagnetic mechanism that works with an elastic member such as a spring. The elastic member can bias connectors RS and RR toward their disengaged position. When activated, electromagnetic mechanism exerts a force on connectors RS and RR that overcomes the bias force of the elastic member and forces the connectors into their engaged position; when deactivated, the electromagnetic mechanism exerts no force and the elastic member forces connectors RS and RR into their disengaged position. Other embodiments can, of course, use different response mechanisms; for instance, one embodiment can use spring-loaded valves to enable and disable flow through connectors RS and RR.

Internal flow response mechanism 316 can be any of mechanisms described above for external flow response mechanism 314, or can be another mechanism not described here. Internal flow response mechanism 316 operates similarly to external flow response mechanism 314: it enables and disables internal connectors SS and SR in internal fluid interface 312. In one embodiment, internal flow response mechanism 316 can be the same or similar to external flow response mechanism 314, but in other embodiments response mechanisms 314 and 316 need not be the same type of mechanism.

Figure 4:
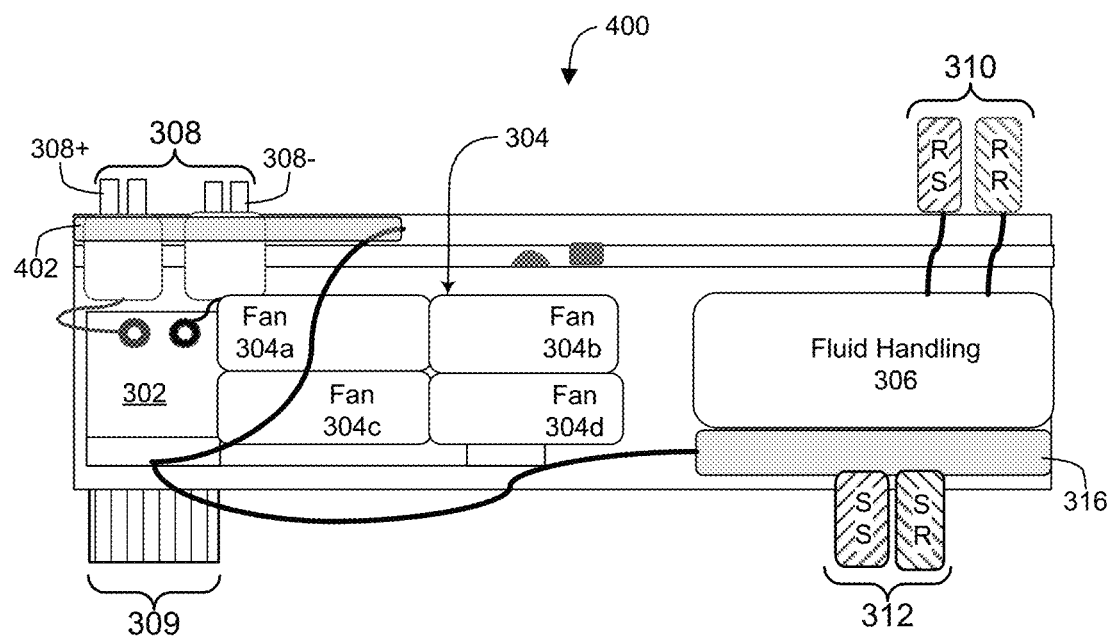
FIG. 4 is a plan view of another embodiment of another utility section that can be used with the server architectures of FIGS. 2A-2B.

FIG. 4 illustrates another embodiment of a utility section 400. Utility section 400 is in most respects similar or analogous to utility section 300 and includes the same primary components: power board 302, fan module 304, and fluid handling module 306. Utility section 400 also includes the same or similar external and internal interfaces: external power interface 308, external fluid interface 310, internal power interface 309, and internal fluid interface 312.

The primary difference between utility sections 400 and 300 is that utility section 400 omits external flow response mechanism 314 but adds an external power response mechanism 402 that is electrically coupled to power board 302 and is coupled to external power interface 308. External power response mechanism 402 is adapted to enable and disable external power interface 308 in case a fault such as a leak is detected. External power interface 308 is enabled if electricity can flow through it and disabled if electricity cannot flow through it. In one embodiment, external power response mechanism 402 can be a mechanism that physically engages and disengages clips 308+ and 308− from the rack busbar. For example, in one embodiment external power response mechanism 402 can be an electromagnetic mechanism that physically engages clips 308+ and 308− when energized and physically disengages clips 308+ and 308− when de-energized. For instance, external power response mechanism 402 can be an electromagnetic mechanism that works with an elastic member such as a spring. The elastic member can bias clips 308+ and 308− toward their disengaged position. When activated, the electromagnetic mechanism exerts a force on clips 308+ and 308− that overcomes the bias force of the elastic member and forces the clips into their engaged position; when deactivated, the electromagnetic mechanism exerts no force, so that the bias force of the elastic member forces clips 308+ and 308− into their disengaged position. Other embodiments can, of course, use different response mechanisms to engage and disengage clips 308+ and 308−.

Figure 5:
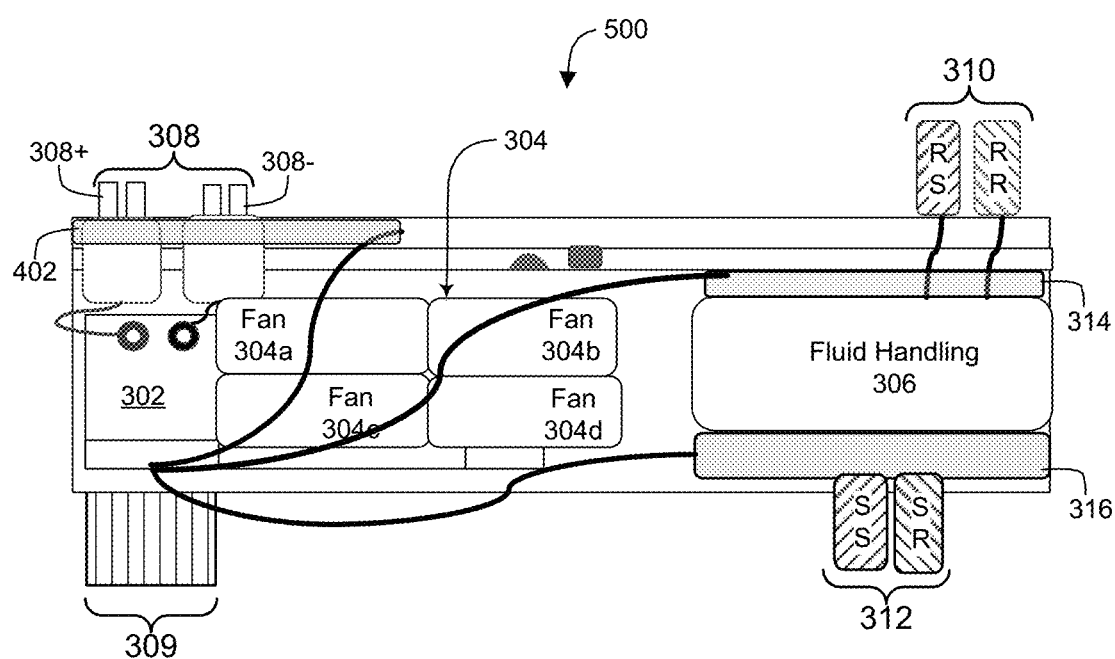
FIG. 5 is a plan view of another embodiment of another utility section that can be used with the server architectures of FIGS. 2A-2B.

FIG. 5 illustrates another embodiment of a utility section 500. Utility section 500 is in most respects similar or analogous to utility sections 300 and 400 and includes the same or similar primary components: power board 302, fan module 304, and fluid handling module 306. Utility section 500 also includes the same or similar external and internal fluid interfaces: external power interface 308, external fluid interface 310, internal power interface 309, and internal fluid interface 312.

The primary difference between utility section 500 and utility sections 400 and 300 is that utility section 500 includes all three response mechanisms described above for sections 300 and 400. That is, it includes external flow response mechanism 314, internal flow response mechanism 316, and external power response mechanism 402. The three response mechanisms in utility section 500 function as described above in connection with utility sections 300 and 400.

Figure 6:
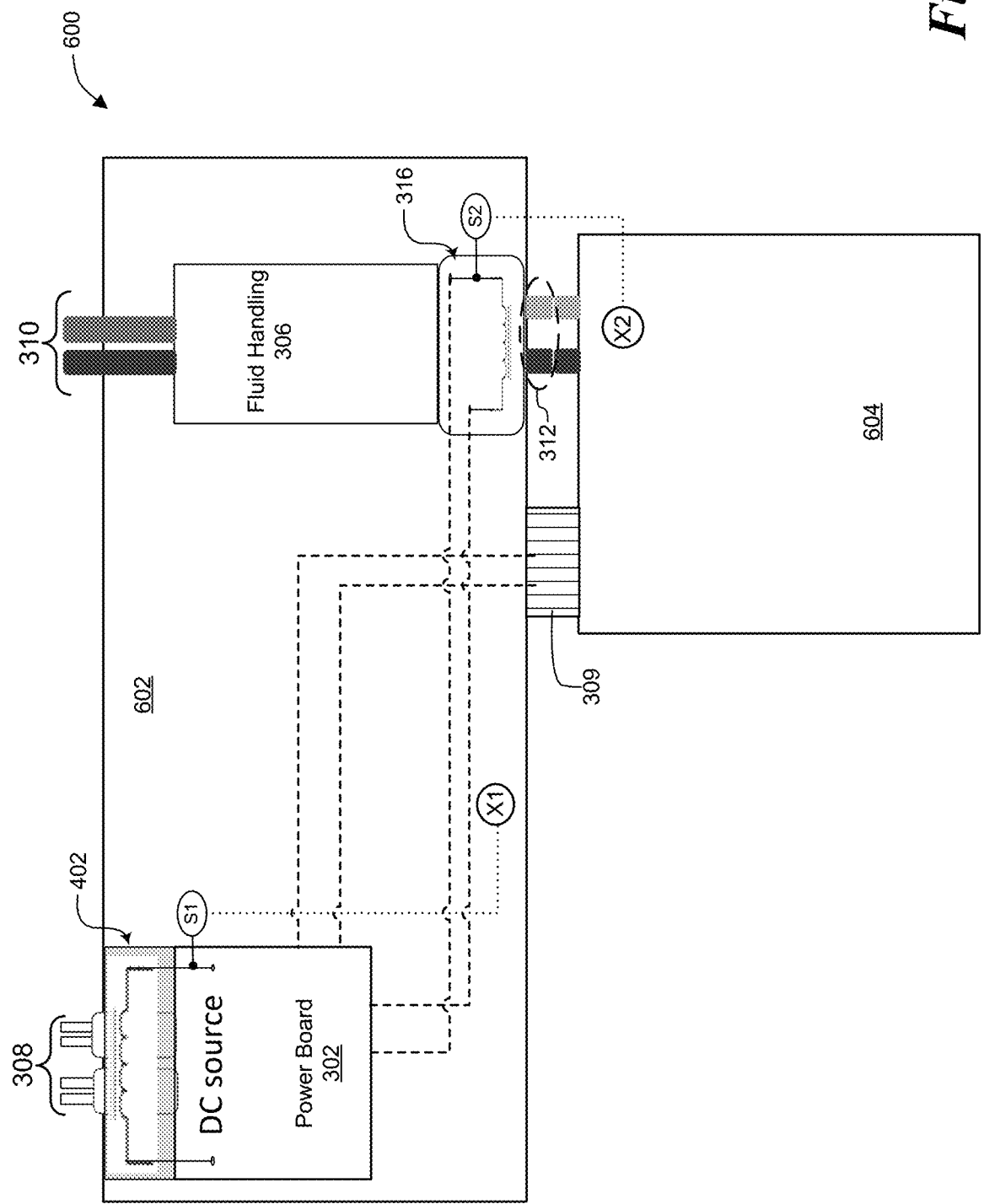
FIG. 6 is a plan view of an embodiment of a server architecture with a utility section.

FIG. 6 illustrates an embodiment of a server architecture 600. Server 600 uses a utility section 602 that substantially corresponds to utility section 400 but includes a few more elements, in particular sensors and switches. For clarity, not all elements of the utility section are shown in this drawing.

In server 600, server electronics in electronics section 604 are coupled to utility section 602 by internal power interface 309 and internal fluid interface 312. Utility section 602 includes a leak-detection sensor X1 that is communicatively coupled to a switch S1 that controls power delivery from power board 302 to external power response mechanism 402, which in this embodiment is an electromagnetic mechanism that engages and disengages external power interface 308 from a rack busbar, as described above. Similarly, electronics section 604 includes a sensor X2 that is communicatively coupled to a switch S2 that controls power delivery from power board 302 to internal fluid interface 316, which in this embodiment is also an electromagnetic mechanism that engages in disengages external fluid interface 312 from an inlet and outlet of electronics section 604 as described above.

Architecture 600 can operate in at least two modes, depending mostly on where a fault such as a leak is detected. The first mode of operation occurs if sensor X1 detects a fault, meaning that there is a leak in utility section 602. When sensor X1 detects a leak, it signals switch S1 to cut power to external power response mechanism 402, thus de-energizing the mechanism, retracting external power interface 308 from the rack busbar, and disabling the external power interface. Disabling the external power interface cuts power to the entire power board 302, thus also cutting power to internal power interface 309 and internal flow response mechanism 316. Cutting power to internal flow response mechanism 316 in turn disables internal fluid interface 312, cutting the flow of cooling fluid to and from electronics section 604. A leak detected by sensor X1, then, shuts down the entire architecture.

The second mode of operation occurs if sensor X2 detects a fault such as a fluid leak but sensor X1 does not, meaning that there is a leak in the electronics section. Sensor X2 signals switch S2 to cut power to internal flow response mechanism 316, thus de-energizing the response mechanism, disabling internal fluid interface 312, and cutting the flow of cooling fluid to IT equipment 706. But because external power response mechanism 402 has not been de-energized, external power interface 308 remains electrically coupled to the rack busbar, so that power board 302 can continue to provide power to other parts of utility section 602, to IT equipment 604, and to any other IT equipment that is coupled to the same utility section.

Figure 7:
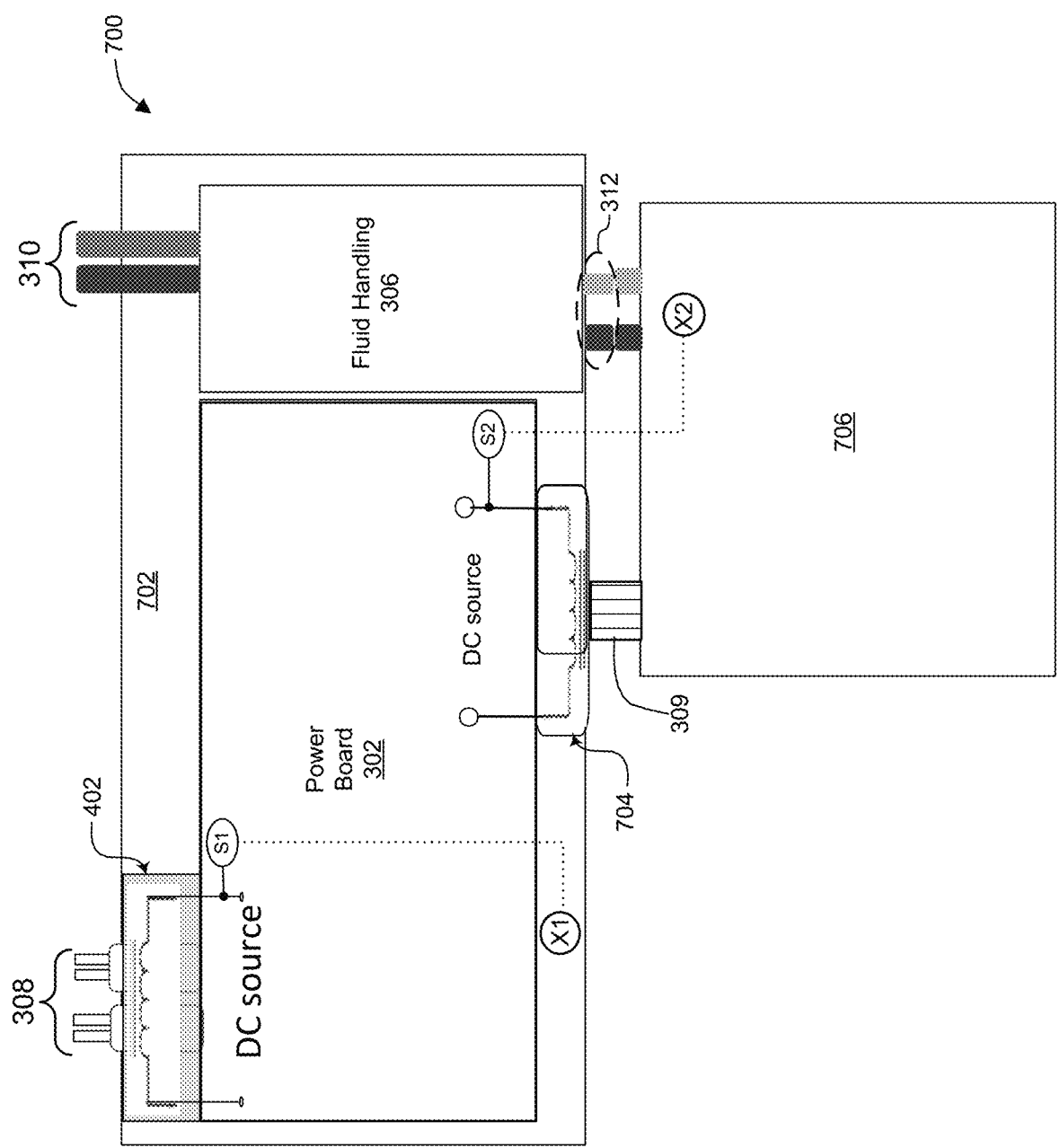
FIG. 7 is a plan view of another embodiment of another server architecture using an embodiment of a utility section.

FIG. 7 illustrates an embodiment of a server architecture 700. Server 700 uses a utility section 702 that is similar to utility sections 300-500. Like the previously-described utility sections, utility section 702 includes external power response mechanism 402 at external power interface 308, but it also includes an internal power response mechanism 704 at the internal power interface 309. Internal power response mechanism 704 is electrically coupled to power board 302 and to sensors and switches. For clarity, not all elements of the utility section are necessarily shown in this drawing.

In server 700, server electronics in electronics section 706 are coupled to utility section 702 by internal power interface 309 and internal fluid interface 312. Utility section 702 includes a leak-detection sensor X1 communicatively coupled to a switch S1 that controls power delivery from power board 302 to external power response mechanism 402, which in this case is an electromagnetic mechanism that engages and disengages external power interface 308 from a rack busbar, as described above for embodiments of utility sections 300-500. Similarly, electronics section 706 includes a sensor X2 communicatively coupled to a switch S2 that controls power delivery from power board 302 to internal power response mechanism 704, which in this embodiment is also an electromagnetic mechanism that engages and disengages external power interface 309 from IT equipment 706.

Architecture 700 can operate in at least two modes, depending mostly on where a fault such as a leak is detected. The first mode of operation occurs if sensor X1 detects a fault, meaning that there is a leak in the utility section. When sensor X1 detects a leak, it signals switch S1 to cut power to external power response mechanism 402, thus de-energizing the mechanism, retracting external power interface 308 from the rack busbar, and disabling the external power interface. Disabling external power interface cuts power to the entire power board 302, thus also cutting power to internal power response mechanism 704 and disabling internal power interface 309. Disabling internal power interface 309 then cuts power to electronics section 706, but because internal fluid interface 312 has not been cut off cooling fluid can continue to circulate through liquid-cooling components of IT equipment 706.

The second mode of operation occurs if sensor X2 detects a fault but sensor X1 does not, meaning that there is a leak in the electronics section. When sensor X2 detects a fluid leak, it signals switch S2 to cut power to internal power response mechanism 704, disabling internal power interface 309 and cutting power to electronics section 706. But power continues to be delivered to external power response mechanism 402; because external power response mechanism 402 has not been de-energized, external power interface 308 remains electrically coupled to the rack busbar and power board 302 can continue to provide power to other parts of utility section 702 and to any other IT equipment that is coupled to the utility section. And because external fluid interface 310 and internal fluid interface 312 have no response mechanisms they are not cut off, meaning that cooling fluid can continue to circulate through liquid-cooling components in electronics section 706 and other electronics sections that can be coupled to utility section 702. FIG. 7 shows the granularity design on the power engage and disengage for individual sections, both the utility section and the one or more electronics sections.

Figure 8:
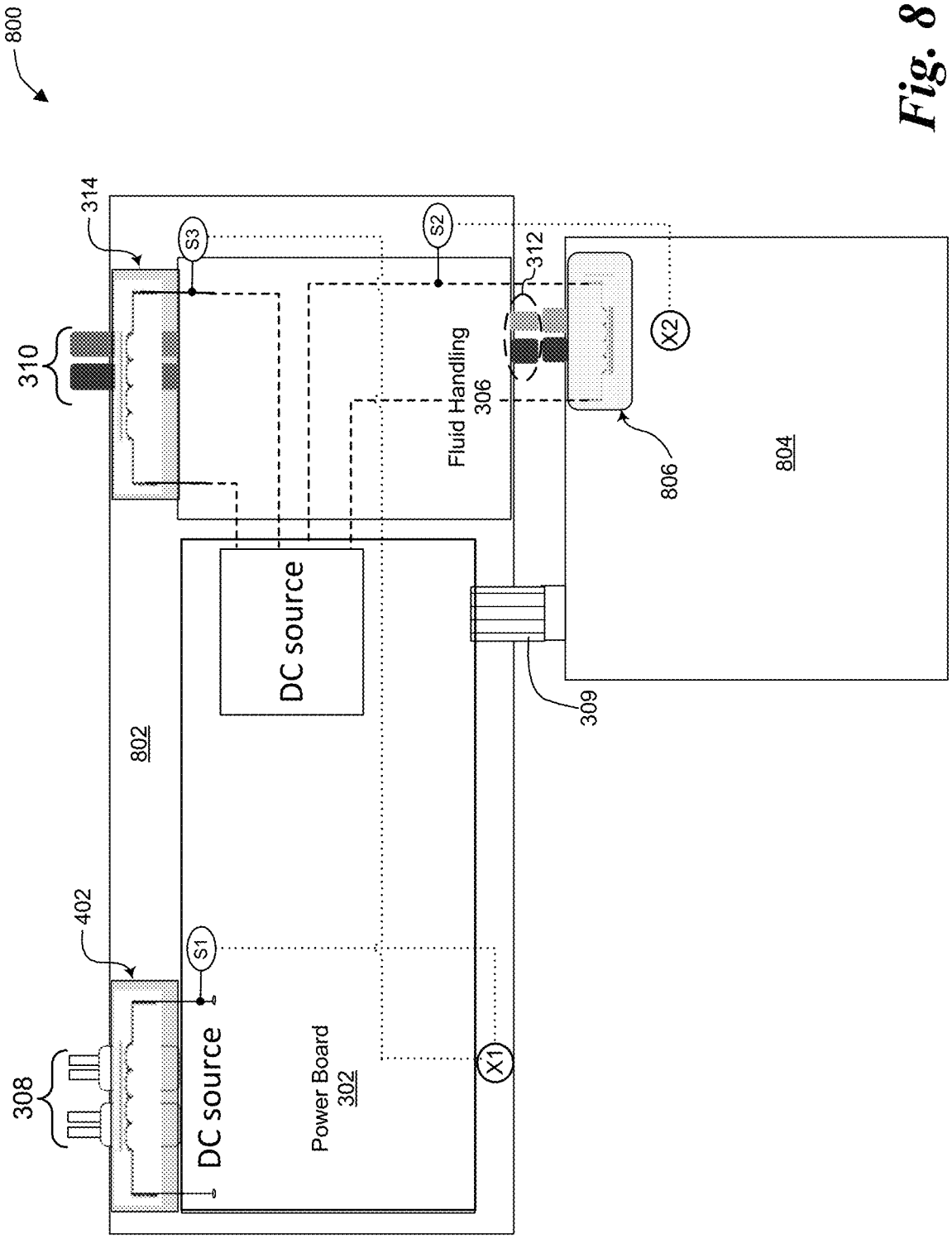
FIG. 8 is a plan view of an embodiment of another server architecture with a utility section.

FIG. 8 illustrates an embodiment of a server architecture 800. Server 800 uses a utility section 802 that is similar but slightly different than utility sections 300-500. Like the previously-described utility sections, utility section 802 includes external power response mechanism 402 at external power interface 308, and an external flow response mechanism 314 at external fluid interface 310. In architecture 800, a response mechanism 806 is positioned in electronics section 804 to disable flow between the utility section and the electronics section; this is different than previous architectures, where internal flow response mechanism 316 that performs a similar function was placed in the utility section instead of in the electronics section.

In server 800, server electronics in electronics section 804 are coupled to utility section 802 by internal power interface 309 and internal fluid interface 312. Utility section 802 includes a leak-detection sensor X1 communicatively coupled to switches S1 and S3. Switch S1 controls power delivery from power board 302 to external power response mechanism 402 and switch S2 controls power delivery from power board 302 to external flow response mechanism 314. Similarly, electronics section 804 includes a sensor X2 communicatively coupled to a switch S2 that controls power delivery from power board 302 to response mechanism 806, which in this embodiment is also an electromagnetic mechanism that engages and disengages internal fluid interface 312.

Architecture 800 can operate in at least two modes, depending mostly on where a fault such as a leak is detected. The first mode of operation occurs if sensor X1 detects a fault, meaning that there is a leak in utility section 802.

When sensor X1 detects a fault, it signals switch S1 to cut power to external power response mechanism 402 and signals switch S3 to cut power to response mechanism 806, thus disabling external power interface 308 and external fluid interface 310. Disabling external power interface 308 cuts power to the entire power board 302, thus also cutting power to response mechanism 806 and disabling internal fluid interface 312. If sensor X1 detects a leak, then, the entire architecture is shut down.

The second mode of operation occurs if sensor X2 detects a fault such as a fluid leak but sensor X1 does not, meaning that there is a leak in the electronics section. If sensor X2 detects a fault such as a fluid leak, it signals switch S2 to cut power to response mechanism 806, thus disabling internal fluid interface 312. Disabling the internal fluid interface cuts off the flow of cooling fluid to electronics section 804, but because response mechanisms 402 and 314 have not been de-energized, power board 302 can continue to provide power and to other electronics sections and fluid handling module 306 can continue to provide cooling fluid to other electronics sections.

Figure 9:
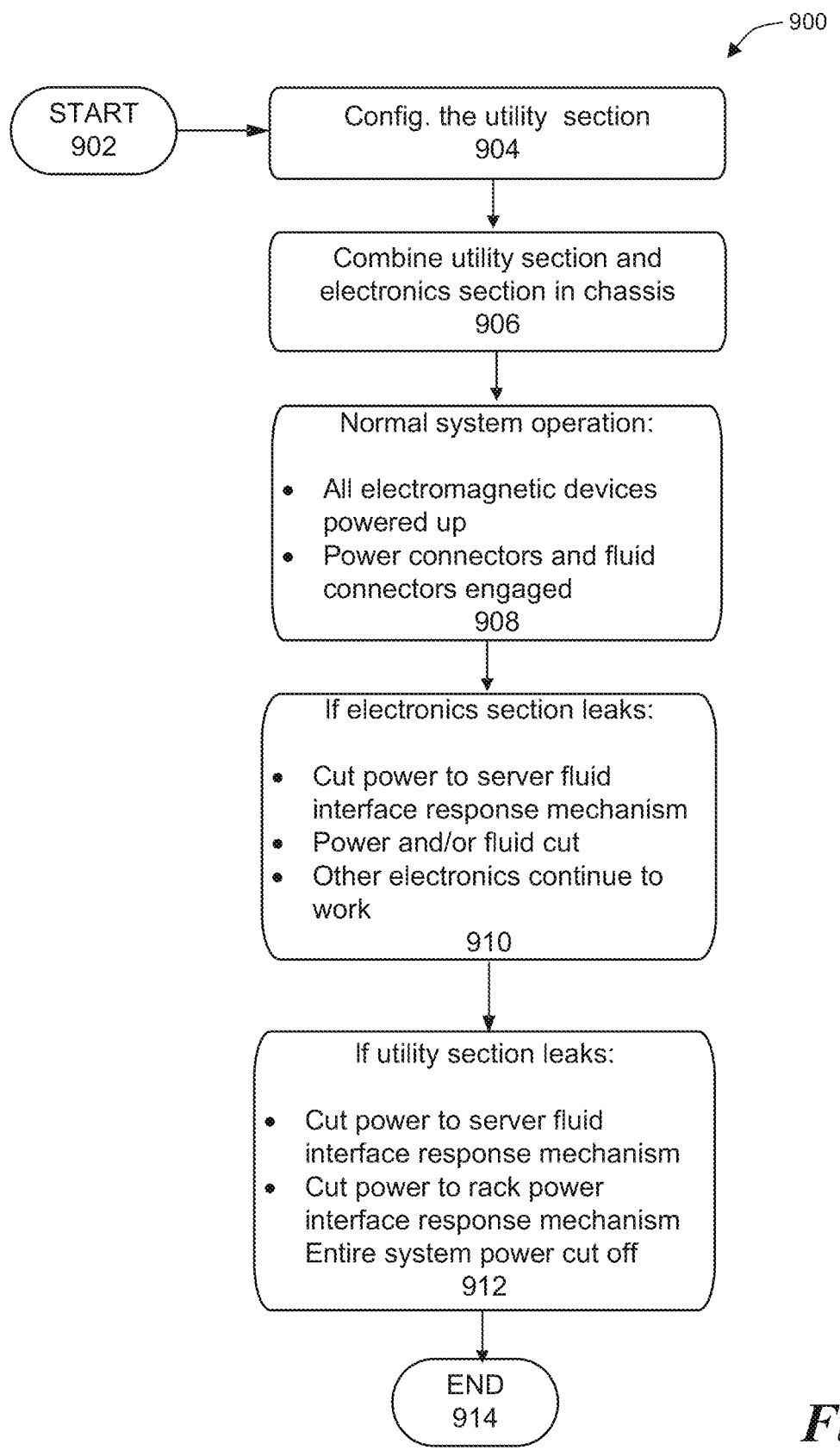
FIG. 9 is a flowchart of an embodiment of a process for operating server architectures such as the ones shown in FIGS. 6-8.

FIG. 9 illustrates, in flowchart form, an embodiment of operation of the servers shown in FIGS. 6-8. The process is discussed below with reference to architecture 600, but it can be extended to architectures 700 and 800. The process starts at block 902. At block 904 the utility section 602 is configured so that it meets the needs of the electronics section 604 with which it will be paired; as discussed above, utility section 602 can include a power board, a fan module, a fluid handling module, and other modules not listed here that can service the IT equipment within electronics section 604. At block 906 the configured utility section 602 is combined with its corresponding electronics section 604 and placed within chassis 202.

At block 908 the system begins normal operation. Response mechanisms 316 and 402, both of which are electromagnetic mechanisms and system 600, are energized or powered up so that their corresponding interfaces—internal fluid interface 312 for internal flow response mechanism 316 and external power interface 308 for external power response mechanism 402—are engaged. Electrical power is then supplied to utility section 602 through external power interface 308 and fluid flows to and from electronics section 604 through fluid interface 312.

At block 910 the process checks whether any leaks in the electronic section are detected by leak-detection sensor X2. If at block 910 no leaks are detected, the system continues normal operation as described at block 908. But if at block 910 leak-detection sensor X2 detects a leak, sensor X2 signals switch S2 to cut power to internal flow response mechanism 316, thus disabling internal fluid interface 312 and cutting off the flow of fluid into and out of electronics section 604. Power can also be cut off to internal power interface 309, thereby cutting off power to electronic section 604. If other electronic sections besides electronic section 604 are coupled to utility section 602, the other electronic sections 604 can continue operating—i.e., utility section 602 can continue providing power and fluid flow to other electronic sections that may be connected to it.

At block 912, the process checks whether any leaks in utility section 602 are detected by leak-detection sensor X1. If at block 912 no leaks are detected, the system continues normal operation as described at block 908. But if at block 912 leak-detection sensor X1 detects a leak in the utility section, sensor X1 signals switch S1 to cut power to external power response mechanism 402, thus disabling external power interface 308 and cutting off power to power board 302. When power is cut off to power board 302, power is also immediately cut off to internal flow response mechanism 316, disabling external fluid interface 312 and stopping the flow of fluid into and out of electronics section 604. With power cut off to power board 302, other electronic sections, if any, that are coupled to utility section 602 cannot continue operating because the entire utility section 602 is shut down. The process ends at block 914.

Other embodiments are possible besides the ones described above. For instance:

The server chassis can be designed in different form factors to accommodate different rack configurations.

Additional cooling or other auxiliary components can be integrated to the functional section.

The structural design and mechanical mechanism for leak response device maybe different.

Multiple fluid interfaces can be used with individually integrated response mechanism.

The architecture maybe used for different chassis form factors, such as different U height.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
a utility section adapted to be positioned in a server chassis with one or more electronics sections housing server components, the utility section adapted to be coupled to the one or more electronics sections, the utility section comprising:
a power board,
a fluid handling module, or a fan module electrically coupled to the power board, or both the fluid handling module and the fan module,
an external power interface including connections adapted to electrically couple the power board to a rack power source and an internal power interface including connections adapted to electrically couple the power board to electronic components in the one or more electronics sections within the chassis,
an external fluid interface including connections adapted to fluidly couple the fluid handling module to a rack fluid source and a rack fluid return and an internal fluid interface including connections adapted to fluidly couple the fluid handling module to liquid cooling components in one or more of the electronics sections, and
an internal flow response mechanism coupled to the internal fluid interface and adapted to enable and disable the internal fluid interface's connections, wherein the internal flow response mechanism is biased toward disabling the internal fluid interface's connections.

2. The apparatus of claim 1, further comprising:
an external power response mechanism coupled to the external power interface and adapted to enable and disable the external power interface's connections.

3. The apparatus of claim 2, further comprising one or more utility leak-detection sensors positioned in the utility section, the one or more utility leak-detection sensors being communicatively coupled to at least the external power response mechanism.

4. The apparatus of claim 2 wherein the power response mechanism enables the external power interface by physically connecting the external power interface to the rack power source and disables the external power interface by physically disconnecting the external power interface from the rack power source.

5. The apparatus of claim 4 wherein the external power interface comprises a pair of clips adapted to be physically coupled to a rack busbar when the clips are at its connection location.

6. The apparatus of claim 2 wherein the internal flow response mechanism enables the internal fluid interface by physically connecting the internal fluid interface to each server fluid inlet and server fluid outlet and disables the internal fluid interface by physically disconnecting the internal fluid interface from the rack power source.

7. The apparatus of claim 6 wherein at least one of the internal fluid interface connections and the external fluid interface connections comprises a pair of dripless blind-mating fittings.

8. The apparatus of claim 2 wherein the power response mechanism is electrically coupled to the internal flow response mechanism, and wherein if the power response mechanism disables the external power interface, the internal flow response mechanism immediately disables the internal fluid interface.

9. The apparatus of claim 2, further comprising:
an external flow response mechanism fluidly coupled to the external fluid interface and communicatively coupled to the sensors, the external flow response mechanism being adapted to enable and disable the external fluid interface; or
an internal power response mechanism coupled to the internal power interface and adapted to enable and disable the internal power interface.

10. The apparatus of claim 1 wherein the utility section is physically segregated from the electronics section.

11. A system comprising:
a server chassis;
one or more electronics sections positioned in the chassis, at least one of the one or more electronics sections housing server components;
a utility section physically segregated from the one or more electronics sections and adapted to be positioned in the server chassis and coupled to the one or more electronics sections, the utility section comprising:
a power board,
a fluid handling module, or a fan module electrically coupled to the power board, or both the fluid handling module and the fan module,
an external power interface including connections adapted to electrically couple the power board to a rack power source, and an internal power interface including connections adapted to electrically coupled the power board to one or more servers in an electronic section within the chassis,
an external fluid interface including connections adapted to fluidly couple the fluid handling module to a rack fluid source and a rack fluid return and an internal fluid interface including connections adapted to fluidly couple the fluid handling module to a server fluid inlet and a server fluid outlet of each of the one or more servers, and
an internal flow response mechanism coupled to the internal fluid interface and adapted to enable and disable the internal fluid interface's connections, wherein the internal flow response mechanism is biased toward disabling the internal fluid interface's connections.

12. The system of claim 11, further comprising:
an external power response mechanism coupled to the external power interface and adapted to enable and disable the external power interface's connections.

13. The system of claim 12 wherein the external power response mechanism enables the external power interface by physically connecting the external power interface's connections to the rack power source and disables the external power interface by physically disconnecting the external power interface's connections from the rack power source.

14. The system of claim 12 wherein the internal flow response mechanism enables the internal fluid interface by physically connecting the internal fluid interface's connections to each server fluid inlet and server fluid outlet and disables the internal fluid interface by physically disconnecting the internal fluid interface's connections from the rack power source.

15. The system of claim 12 wherein the external power response mechanism is electrically coupled to the internal flow response mechanism, and wherein if the power response mechanism disables the external power interface, the internal flow response mechanism immediately disables the internal fluid interface.

16. The system of claim 12, further comprising:
one or more utility leak-detection sensors positioned in the utility section, the one or more utility leak-detection sensors being communicatively coupled to at least the external power response mechanism; and
one or more electronics leak-detection sensors positioned in the electronics section, the one or more electronics leak-detection sensors being communicatively coupled to at least the internal flow response mechanism.

17. The system of claim 16, further comprising:
an external flow response mechanism fluidly coupled to the external fluid interface, the external flow response mechanism being adapted to enable and disable the external fluid interface; or
an internal power response mechanism coupled to the internal power interface and adapted to enable and disable the internal power interface.

18. The system of claim 17 wherein:
the one or more utility leak-detection sensors are communicatively coupled to the external flow response mechanism; and
the one or more electronics leak-detection sensors are communicatively coupled to the internal power response mechanism.

19. The system of claim 11 wherein the utility section is physically segregated from the electronics section.

20. The system of claim 11 wherein at least one of the internal fluid interface connections and the external fluid interface connections comprises a pair of dripless blind-mating fittings.

* * * * *